United States Patent
Matsuzaki et al.

(10) Patent No.: US 6,944,056 B2
(45) Date of Patent: Sep. 13, 2005

(54) SEMICONDUCTOR NON-VOLATILE STORAGE DEVICE

(75) Inventors: Nozomu Matsuzaki, Kokubunji (JP); Hideaki Kurata, Kokubunji (JP); Takayuki Kawahara, Higashiyamato (JP)

(73) Assignee: Renesas Technology Corp., Tokyo (JP)

( * ) Notice: Subject to any disclaimer, the term of this patent is extended or adjusted under 35 U.S.C. 154(b) by 90 days.

(21) Appl. No.: 10/473,817

(22) PCT Filed: Apr. 2, 2001

(86) PCT No.: PCT/JP01/02856

§ 371 (c)(1),
(2), (4) Date: Oct. 2, 2003

(87) PCT Pub. No.: WO02/082460

PCT Pub. Date: Oct. 17, 2002

(65) Prior Publication Data

US 2004/0140485 A1 Jul. 22, 2004

(51) Int. Cl.[7] .............................................. G11C 11/401
(52) U.S. Cl. ............................. 365/185.05; 365/185.13; 365/185.11; 365/185.17; 365/185.23; 365/185.21
(58) Field of Search ....................... 365/185.05, 185.13, 365/185.11, 185.17, 185.23, 185.21, 189

(56) References Cited

U.S. PATENT DOCUMENTS

| | | | | |
|---|---|---|---|---|
| 5,748,545 A | * | 5/1998 | Lee et al. ..................... | 365/201 |
| 5,754,469 A | * | 5/1998 | Hung et al. ............. | 365/185.03 |
| 5,986,939 A | * | 11/1999 | Yamada .................. | 365/185.29 |
| 6,424,002 B1 | * | 7/2002 | Kondo et al. ................ | 257/316 |
| 6,507,525 B1 | * | 1/2003 | Nobunaga et al. .......... | 365/203 |
| 6,621,744 B2 | * | 9/2003 | Kojima .................. | 365/185.23 |
| 6,781,904 B2 | * | 8/2004 | Lee et al. ..................... | 365/207 |
| 2003/0043623 A1 | * | 3/2003 | Shimbayashi et al. . | 365/185.05 |
| 2003/0072176 A1 | * | 4/2003 | Watanabe ............... | 365/185.18 |

FOREIGN PATENT DOCUMENTS

| | | | | |
|---|---|---|---|---|
| JP | 5-67791 | 3/1993 | | |
| JP | 2576510 | 11/1996 | | |
| JP | 9-219524 | 8/1997 | | |
| JP | 410228766 A | * 8/1998 | ......... | G11C/11/401 |
| JP | 11-87660 | 3/1999 | | |
| JP | 11-96784 | 4/1999 | | |

* cited by examiner

*Primary Examiner*—Viet Q. Nguyen
(74) *Attorney, Agent, or Firm*—Miles & Stockbridge P.C.

(57) ABSTRACT

A semiconductor non-volatile storage device of the present invention which lets a memory cell directly drive up to a local bit line, wherein the output of the local bit line is received by a gate electrode of a separately-provided signal amplifying transistor, and the signal amplifying transistor is used to drive a global bit line having a large load capacity. Since an amplifying transistor having a drive power higher than a memory cell drives the parasitic capacity of a global bit line, information stored in a memory cell can be read out at high speed. Therefore, the storage device is used for storing program codes for controlling microcomputers or the like to thereby enhance a system performance.

52 Claims, 10 Drawing Sheets

SEMICONDUCTOR NON-VOLATILE STORAGE DEVICE

TECHNICAL FIELD

The present invention relates to a semiconductor non-volatile storage device and more particularly to a semiconductor non-volatile storage device, which allows fast readout operation.

BACKGROUND ART

A semiconductor non-volatile storage device has such a characteristic that information stored therein would not volatile even when the power switch is turned off. Conventionally, semiconductor non-volatile storage devices have been used as storage devices for storing voice or image data. For that reason, they have been developed focusing on higher density and non-volatility. In recent years, among semiconductor non-volatile storage devices, those of "NOR-type structure" having an excellent property of fast operation have been supplied for storing cellular phone program codes and other purposes and a their market is rapidly growing.

FIG. 1 is a diagram of a circuit having a NOR-type structure. In this figure, only two local bit lines LB1 and LB2 are shown in a memory cell array region CA. The common regions of the diffusion layers of the memory cells arrayed into rows to which a source drain path is serially connected, are connected to the local bit lines LB1 or LB2 alternately. The remaining common regions of the diffusion layers are all connected to the memory source terminal VSM. In general, the potential of the memory source terminal VSAM is assumed to be 0V. 32 Word lines W01 to W32 are assured to be used for selecting individual memory cells in the figure.

Now, the procedure for reading out information stored in, for example the memory cell connected to the local bit line LB1, is described. A positive potential is applied to a selection signal line SwA1 and a selection transistor ST1 is turned on. The local bit line LB1 is pre-charged via a global bit line GB1. Then, the potential on the desired word line (any of W01 to W32) is raised for selection. For example, the selection of the word line W01 allows information stored in the memory cell MC01 to be read out. If the information stored in the memory cell MC01 with its associated gate potential raised is "0", namely, a threshold for the memory cell MC01 is high, the memory cell MC01 is not turned on with no change in pre-charge potential. On the other hand, if the stored information is "1", namely, if the threshold for the memory cell MC01 is low, the memory cell MC01 is turned on and the potential on the local bit line LB1 is supplied to the global bit line GB1 via the memory cell MC01, being detected in a sense amplifier SA1.

Among various types of sense amplifiers being used, a single-end type of sense amplifier SA1, which is well known, is shown in the figure. This sense amplifier SA1 is composed of two inverters INV1 and INV2, a transistor NM, and a load resistance REG. Usually, the local bit lines LB1 and LB2, each of which is composed of a low-resistance metal wire, have lower parasitic resistances compared with other types of non-volatile storage devices. For that reason, among the sense amplifiers for the semiconductor non-volatile storage devices, this type is most suitable for fast information readout. Note that the operation of the sense amplifier SA1 will be explained later in the description of one preferred embodiment of the present invention in reference to FIG. 3 shown.

FIG. 2 is a plan layout diagram of the circuit structure shown in FIG. 1. In FIG. 2, a reference symbol CA indicates a memory cell array region and ST1G and ST2G are corresponding to gate electrodes of the selection transistors ST1 and ST2, each of which connects a signal line from a global bit line GB1 to the local bit lines LB1 and LB2, respectively, namely the selections signal lines SWAL and SWA2 shown in FIG. 1. VIAL is a contact hole, which connects the gate electrode or the diffusion layer to the first metal wiring layer, for example an interlayer via hole, which connects the local bit lines LB1 and LB2 to the drain diffusion layer region of the memory cell. On the other hand, VIA2 is a contact hole, which connects the metal wiring in the first layer to that in the second layer, for example an interlayer via hole, which connects the global bit line GB1 to the local bit lines LB1 and LB2. Note that the layout of the sense amplifier element is omitted.

To connect a signal line to the local bit line LB1, voltage is applied to the selection signal line SWA1 and to connect the signal line to the local bit line LB2, voltage is applied to the selection signal line SWA2. VSSCOM is the source diffusion region of the memory cell, which is commonly connected to a memory source terminal VSM so that potential may be applied. In general, the applied potential is 0 V.

In the case of being used for storing program codes, unlike for storage use, memory cells need to output information as quickly as possible in line with a logical circuit operating at a high speed. It is difficult even for the above-mentioned storage device having a NOR-type structure suitable for fast information readout to keep in line with the existing logical circuits operating at high speeds. The reason is that an on current flowing through the non-volatile storage cells (hereafter, simply referred to as "memory cells or memory transistors") is too small to drive the parasitic load capacitance on the signal wirings quickly.

System performance cannot be enhanced unless the semiconductor non-volatile storage device containing program codes is capable of outputting information at a speed in line with the processor's operation speed. Alternatively, such a method may be assumed that for the system to be ready for run, the information stored in the semiconductor non-volatile storage device is read out into another fast storage device. In the case of the mobile devices including the mentioned-above one, however, this method causes such problems as larger device sizes and increased costs, meaning that it is anything but a best bet.

In this context, the objective of the present invention is to provide a semiconductor non-volatile storage device suitable for mobile device use, which can be used in reading out program codes at a high speed.

DISCLOSURE OF THE INVENTION

A semiconductor non-volatile storage device of the present invention has a characteristic in that it is structured so that memory cells may drive up to its local bit lines in reading information, from which the gates of separately-provided signal amplifying transistors may receive outputs to drive global bit lines having a larger load capacitance.

Namely, in this structure, the output from the output terminal of the memory cell is supplied directly to the gate electrode for the signal amplifying transistor disposed in the vicinity of the memory cell and the current output from the electrode is supplied to a signal detection circuit, a sense amplifier, as a signal.

This structure enables the parasitic capacitance on the global bit line, which has been conventionally driven by means of on current of the memory cell, to be driven by the high amplifying transistor having a driving power higher than that of the memory cell, achieving fast readout of information stored in the memory cell. Note that it goes without saying that the parasitic capacitance, which can be driven by the signal amplifying transistor, must be set to the value larger than the load capacitance, which can be driven by the memory cell.

BEST MODE FOR CARRYING OUT OF THE INVENTION

Now, referring to accompanied drawings, preferred embodiments of the semiconductor non-volatile storage device of the present invention are described below in detail.
<Embodiment 1>

Figure 3:
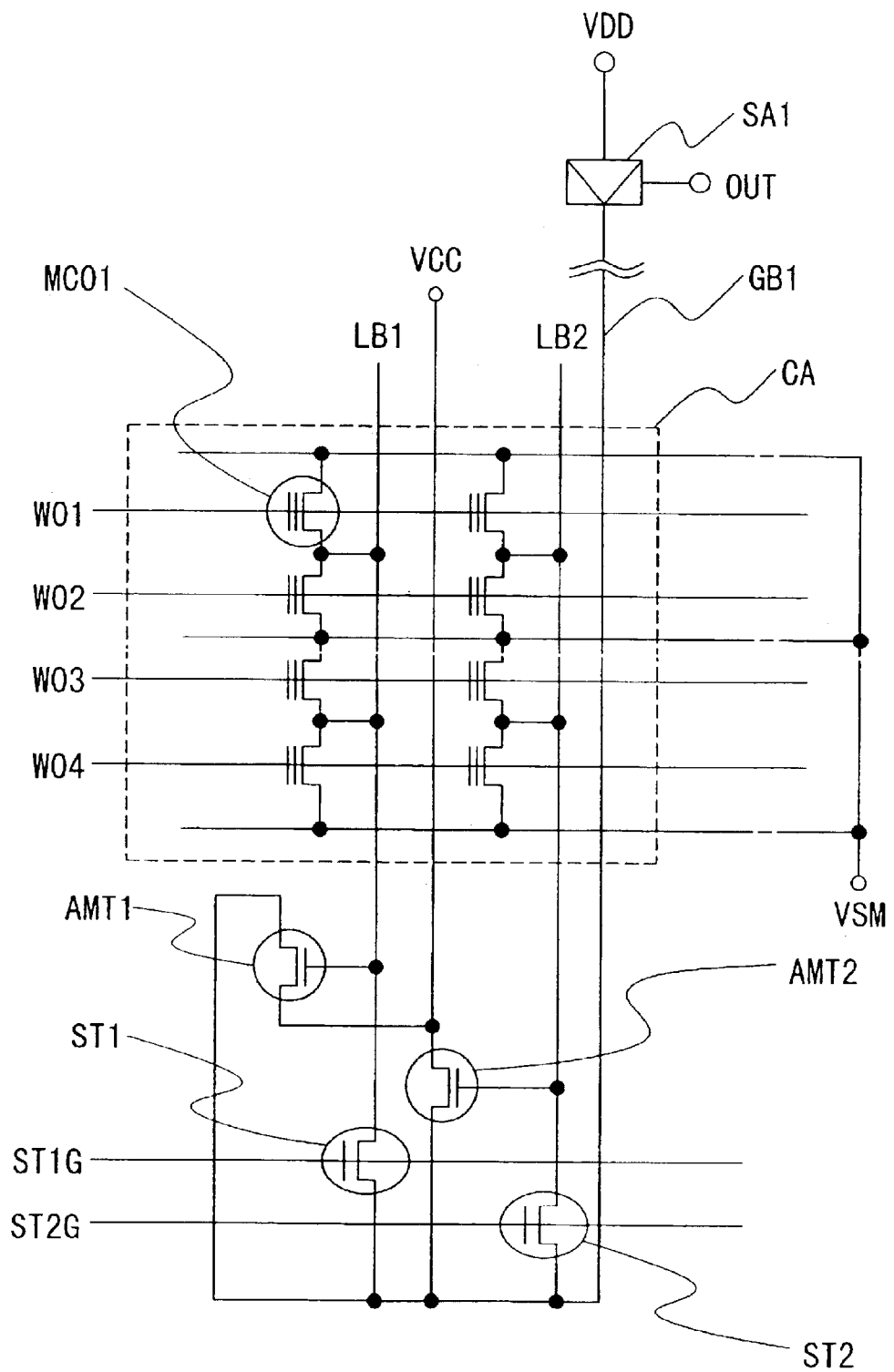
FIG. 3 is a diagram showing the important circuit block of the semiconductor non-volatile storage device having a NOR-type structure according to one preferred embodiment of the present invention.

FIG. 3 is a diagram of the circuit of the semiconductor non-volatile storage device according to one preferred embodiment of the present invention. After the example of a prior art shown in FIG. 1, only local bit lines LB1 and LB2 are indicated.

To prevent the drawing from being complicated, only four memory cells are shown, to which the number of memory cells of the present invention is not limited. Note that the same reference symbols are used to indicate the corresponding components to those shown in FIG. 1. In addition, the symbols identifying terminals also indicate wiring names and signal names, and for the power source, the voltage values in the following descriptions.

The local bit line LB1 is connected to the drain diffusion layer of the selection transistor ST1 and also to the gate electrode of the signal amplifying transistor ATM1. The drain for the signal amplifying transistor AMT1 is connected to a source voltage supply terminal VCC and the source is connected to the global bit line GB1.

Now, readout operation will be explained below. The selection transistor ST1 is turned on to pre-charge the local bit line LB1 via the global bit line GB1. In this case, the potential is assumed to be 1 V. Then, the selection transistor ST1 is turned off to keep the local bit line LB1 at a voltage of 1V. After then, the global bit line GB1 is reset to 0 V. The desired word line is selected to read out the information stored in the memory cell. For example, the word line W01 is selected to read out the information stored in the memory cell MC01.

If the threshold for the memory cell MC01 is higher than the read voltage applied on the word line (referred to as 'H'), the potential of the pre-charged local bit line LB1 remains unchanged with no discharge. For that reason, the voltage at the gate for the signal amplifying transistor AMT1 connected to the local bit line LB1 is also kept at the pre-charge voltage 1 V. Note that the signal amplifying transistor ATM1 is on without power being supplied. No current, of course, flows into the signal amplifying transistor ATM1. At this stage, if a positive voltage, for example 1 V, is applied to the source voltage supply terminal VCC, a current flows from the power source VCC into the global bit line GB1 via the signal amplifying transistor AMT1. The potential of the global bit line GB1, which has been initially at 0 V, when a current is supplied from the power source VCC, raises from 0 V to 1 V. This change in voltage is detected at the sense amplifier SA1. The operation of the sense amplifier SA1 is described later.

If the threshold for the memory cell MC01 is lower than the read voltage applied on the word line (referred to as 'L'), the potential of the pre-charged local bit line LB1 is discharged via the memory cell MC01. For that reason, the voltage at the gate for the signal amplifying transistor ATM1 connected t the local bit line LB1 drops to 0 V. Note that the signal amplifying transistor AMT1 is off without power being supplied. At this stage, even when a positive voltage, for example 1V, is applied to the source voltage supply terminal VCC, no current flows from the power source VCC into the global bit line GB1. The global bit line GB1 at first at 0 V keeps 0 V as it is.

Note that the information stored in the memory cell connected to the local bit line LB2 may be read out in the same manner as that mentioned above. The explanation of the memory cell connected to the local bit line LB2 are omitted from the descriptions of the succeeding preferred embodiments.

Figure 1:
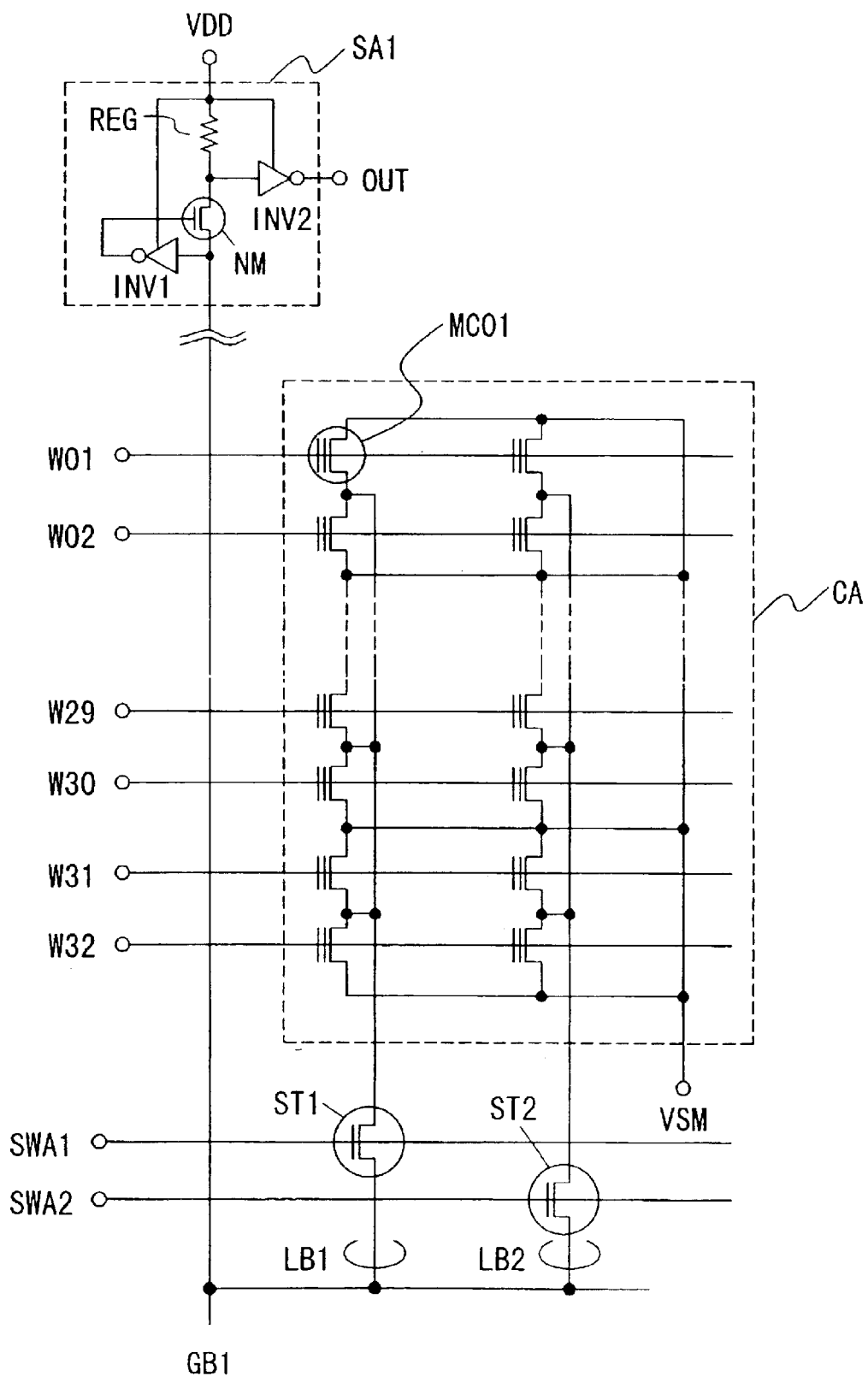
FIG. 1 is a diagram showing the important circuit block of the conventional semiconductor non-volatile storage device having a NOR-type structure.

To explain the sense amplifier SA1, signal detection using a single-end type amplifier having the structure, which is well known, shown in FIG. 1 is given as an example found in the prior art. If the memory cell MC01 is 'H', the global bit line GB1 is at 1 V. An inverter INV1, when 1 V is applied as an input, generates an inversion output 0V. Since the inversion voltage is input on the gate electrode of a transistor NM, the transistor NM is turned off. For that reason, the current always supplied from the power source VCC via a load resistance REG is input to an inverter INV2, which cause the inverter INV2 to generate the inversion output 0 V, resulting in 0 V output from an output terminal OUT. If the memory cell MC01 is 'L', the states of the inverter INV1 and the transistor NM are inverted, namely the output from the inverter INVL is the source voltage VDD and the transistor NM is turned on. Since the current passing through the load resistance REG flows into the signal amplifying transistor AMT1, causing charge share, the potential input to the inverter INV2 does not restore to its original level. For that reason, at that time, the inversion output from the inverter INV2 is the source voltage VDD, resulting in the voltage VDD output from the output terminal OUT. This is the principle of stored information readout operation.

In general, signal propagation developing on the global bit line (in this case, equivalent to GB1) is due to charge and discharge caused by the current from the memory cell. If this current is small, the transition speed, at which signal transition occurs on the global bit line, becomes low. To react to the input current quickly, it is essential to make the current larger. For the memory cells, wherein they may drive the global bit line GB1 via a control gate and the oxide films of their gates have any of thicknesses 12 to 8 nanometers, it is difficult to allow a large current to flow.

The present invention has a characteristic in that it has been structured so that a small on current flowing the memory cells may be used to drive only up to the local bit lines out of load capacitances and standard MOS transistors, wherein the oxide films of the gates are thinner than those of the memory cells and a larger current can flow through them, are used to drive the global bit line. The selection transistors ST1 and ST2 directly control high read voltages and in many cases, are used to control the highest erase voltage. The oxide film of the gate for the memory cell does not have the thickness equal to or larger than that of the selection transistors ST1 and ST2 because it generates an FN (Fowler-Nordhein) tunnel current at erase operation. For the signal amplifying transistors AMT1 and AMT2, the thickness of the oxide films of their gates must be thinner as possible as they can endure the voltage applied at operation because a driving power takes precedence. For that reason, the relationship among the thicknesses of these three types of gate oxide films is set in the order of selection transistors>memory cells>signal-amplifying transistors.

To give supplemental information, rewrite operation on the memory cells shown in FIG. 3 is described giving as an example of the memory cell MC01. In this case, it is defined that the state 'L' is erase and 'H' is write. Erase operation involves application of a negative voltage to the control gate electrode to release negative charge stored on a floating fate electrode toward a substrate. An indirect current (FN current) is used to perform this step. Hot electron injection is used to write information.

First of all, 10 V of voltage is applied to the control gate electrode. Then, a voltage is applied to the drain diffusion layer of memory cell. The applied voltage is generally 5 V, which is applied from the signal amplifying transistor AMT1 via the selection transistor ST1. The word line W01, namely the memory cell MCO with 10 V applied to its control gate is turned on when it goes to the high bias state and changes to the 'H' state when generated hot electrons are injected, resulting in read operation.

At that time, 5 V is applied to the side of the diffusion layer of the signal amplifying transistor AMT1, which is connected to the global bit line GB1 and also applied to its gate electrode. Unavoidably, the signal amplifying transistor ATM1 has low electric strength because it has been structured so that its load driving power may be enhanced at low voltage input (read voltage 1 V). With the source voltage supply terminal VCC kept open, the potential between the voltage applied t the gate electrode and the source voltage supply terminal VCC side may rise instantaneously up to 5 V. In case of such an event, there is a worry that dielectric breakdown may occur in the gate oxide film. To overcome this problem, in synchronization with the timing when a write voltage is applied to the global bit line GB1, 5 V of voltage is applied to the source voltage supply terminal VCC and the well of the signal amplifying transistor AMT1 as well.

This causes an electric field 0 to be applied to the gate oxide film, preventing dielectric breakdown from occurring. Hereafter, unless otherwise indicated, it is assumed that overwrite operation is based on the principle "hot electron injection/FN release" mentioned earlier. The structure shown in FIG. 3 has an advantage of having a smaller array area because the same single line can be used for both the write potential supply line and the read bit line.

Figure 2:
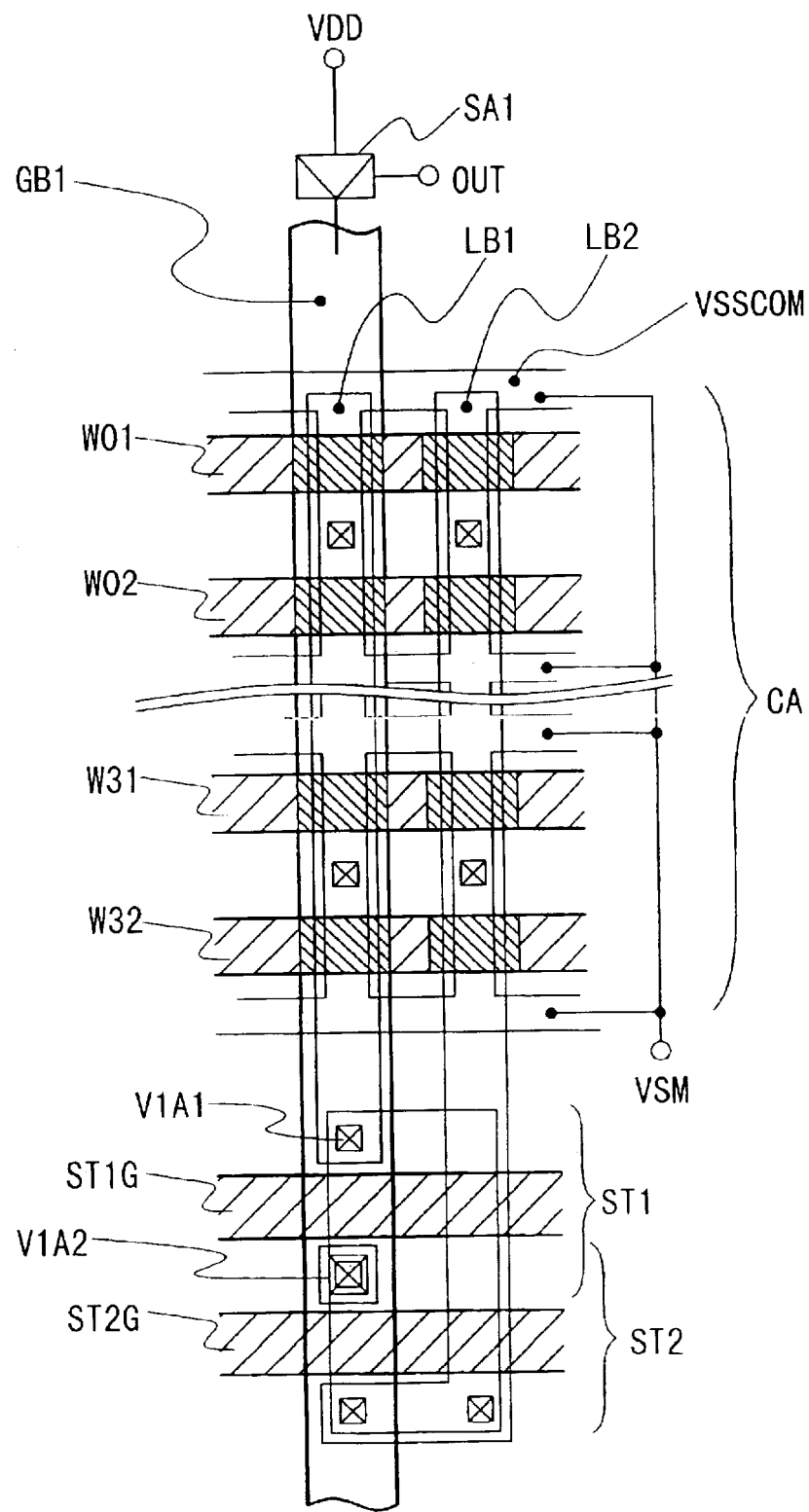
FIG. 2 is a plan layout diagram of the circuit structure shown in FIG. 1.
Figure 4:
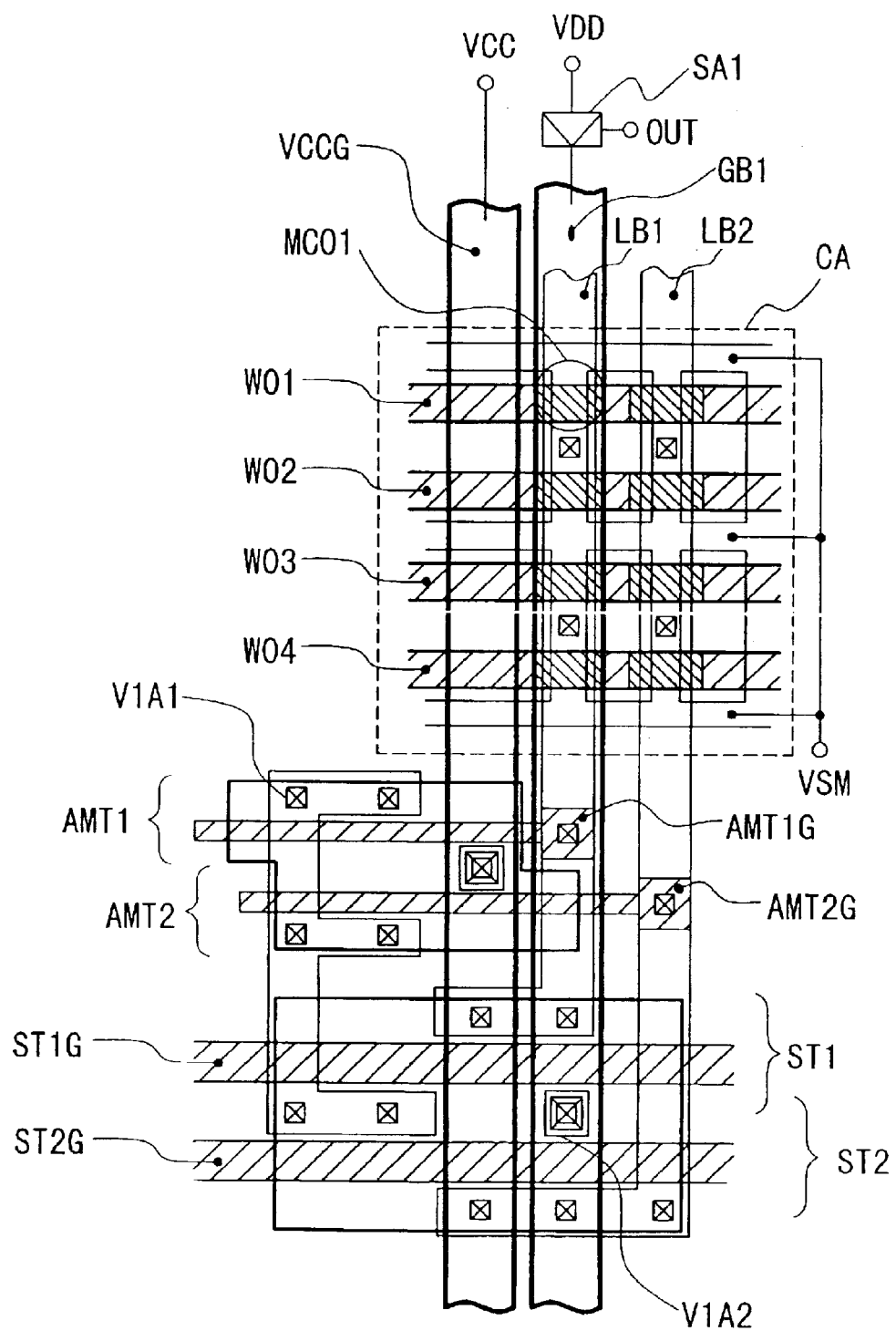
FIG. 4 is a plan layout diagram of the circuit structure shown in FIG. 3.

FIG. 4 is a plan layout diagram of the circuit structure shown in FIG. 3. Note that the layout of the sense amplifier element is omitted as found in the example of the prior art shown in FIG. 2. The difference in structure between the circuit of the present invention and the NOR-type circuit of the prior art is in that the former has the gate electrodes AMT1G and AMT2G for the signal amplifying transistors AMT1 and AMT2 incorporated.

In FIG. 4, the reference symbol GBB indicates an electrode wiring for the global bit line GB1 in the second layer, which are connected to the diffusion layer common to the selection transistors ST1 and ST2 via the via hole vertically stacked through the electrode wiring layer in the first layer. The local bit lines LB1 and LB2 are connected to the drain diffusion layers of the memory cells vial the interlayer via hole VIA1 as in the example of the prior art and also to the source diffusion layers of the selection transistors ST1 and ST2 via the via hole VIA1, respectively. In addition, in this preferred embodiment, the local bit lines LB1 and LB2 are connected to the gate electrodes AMT1G and AMT2G for the signal amplifying transistors AMT1 and AMT2 via the VIA hole VIA1, respectively. The electrode wiring VCCG in the second layer, to which a source voltage is applied, is connected t the diffusion layer common to the signal amplifying transistors AMT1 and AMT2 via the via hole vertically stacked through the electrode wiring layer in the first layer. This layout achieves the circuit shown in FIG. 3. Note that the electrode wiring GBB for the global bit line in the second layer is connected to the sense amplifier SA1, though its layout diagram is omitted. Similarly, the memory cell common diffusion layer is the memory source terminal VSM, though its layout diagram is omitted.

IN FIG. 4, a group of signal amplifying transistors are disposed between the memory array region CA and the selection transistors, though alternatively, they may be disposed outside the memory cell array region and the selection transistors.

Figure 5:
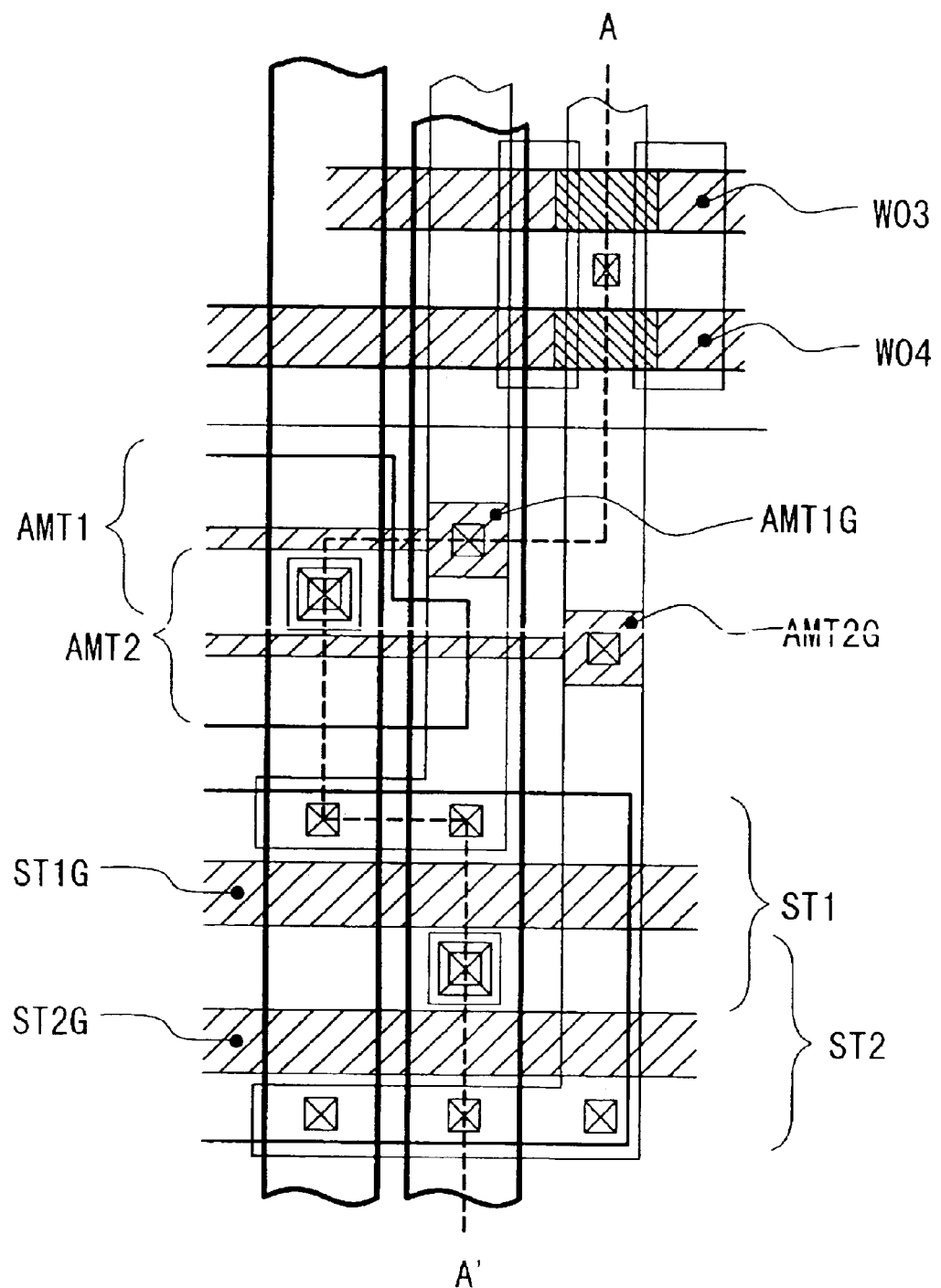
FIG. 5 is a plan layout diagram of the important block of the layout shown in FIG. 4.
Figure 6:
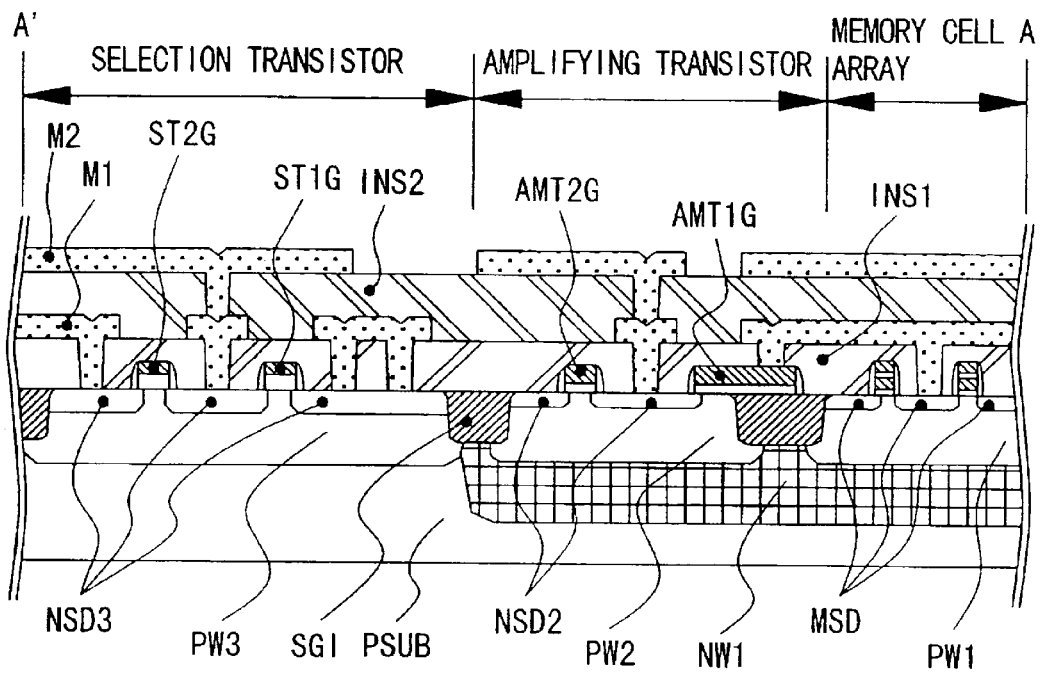
FIG. 6 is a cross-sectional diagram of the structure along the line A–A'shown in FIG. 5.
Figure 7:
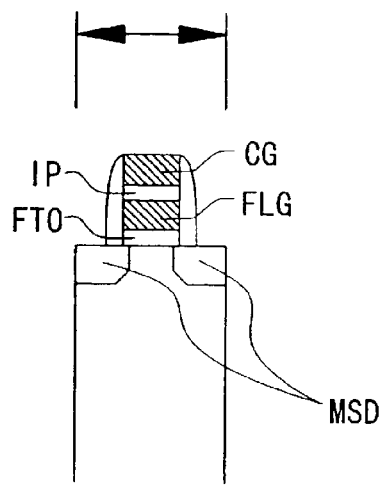
FIG. 7 is an enlarged cross-sectional view of the memory cell region shown in FIG. 6.

In FIG. 5, the main block of the layout shown in FIG. 4. FIG. 6 is a cross-sectional view of the circuit structure along the block indicated by the line A–A' and FIG. 7 is an enlarged cross-sectional view of the memory cell element shown in FIG. 6. In FIG. 6, the reference symbol PSUB indicates a p-type silicon substrate, on which a p-type well PW1 for the memory cell, a p-type well PW2 for the signal amplifying transistor, and a p-type well PW3 for the selection transistor are formed. The p-type well PW1 is separated by an n-type layer NW1 because a voltage is applied only to the memory cell tunnel film when information is erased. When a write voltage is applied, a positive voltage needs to be applied to the p-type well PW2 to prevent dielectric breakdown from occurring in the gate for the signal amplifying transistor. For that reason, the p-type well PW2 is also separated by the n-type well NW1. SGI indicates a shallow-trench element separating region.

As shown in FIG. 7, the memory cell has a laminated structure, which is composed of a source and drain region MSD, a tunnel oxide film FTO, a floating gate electrode FLG, a poly-silicon interlayer film IP, and a control gate CG.

In FIG. 6, NSD2 is the source and drain region for the signal amplifying transistor and NSD3 is the source and drain region for the selection transistor. The level of the junction electric strength is set in the order of the selection transistor, which is directly involved in the highest voltage>the memory cell, for which the largest applied voltage is the drain voltage at write operation>the selection transistor, whose driving power has precedence at read operation, for the same reason as that in the explanation of the relationship among the thicknesses of the gate oxide films. In this cross-sectional view, the gate electrodes AMT1G and AMT2G for the signal amplifying transistors and the gate electrodes ST1G and ST2G for the selection transistors are shown. INS1 is an inter-wiring layer film in the first layer, through which a hole is made to use for connecting the individual source, drain, and gate electrodes at a metal wiring layer M1 in the first layer. In addition, INS2 is deposited, through which a hole is made to connect the wiring layer M2 in the second layer. The circuit structure shown in FIG. 3 according to one preferred embodiment of the present invention and its plan layout (FIG. 4), and cross-sectional structure (FIGS. 6 and 7) have been explained. In the descriptions of the succeeding preferred embodiments, a circuit composed of four memory cells as found in FIG. 1 is used as an example.

<Embodiment 2>

Figure 8:
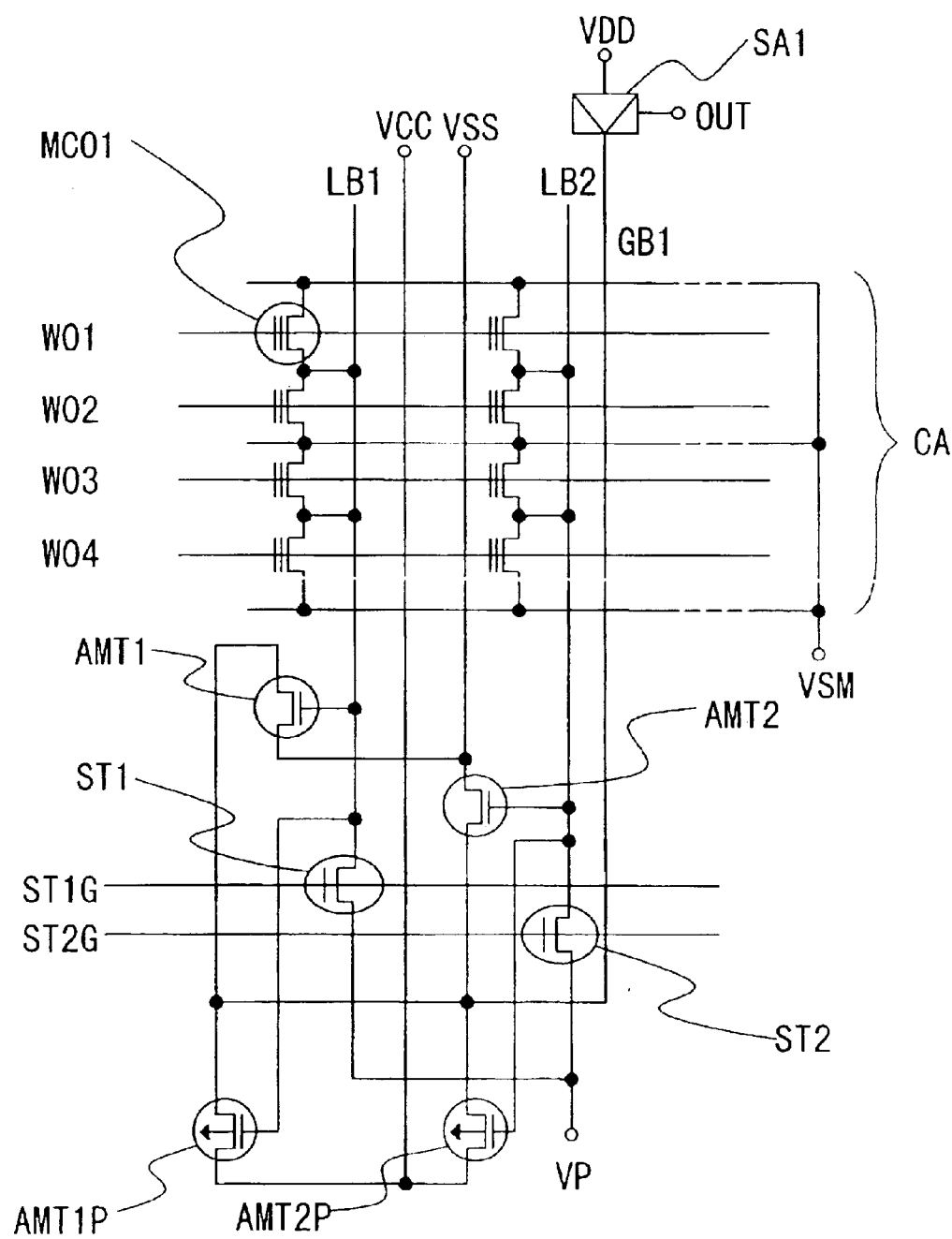
FIG. 8 is a diagram showing the important circuit block of the semiconductor non-volatile storage device according to one of other preferred embodiments of the present invention.

FIG. 8 is a circuit diagram showing the semiconductor non-volatile storage device according to one of other preferred embodiments of the present invention. The semiconductor non-volatile storage device according to this preferred embodiment is based on the same operation principle as that of the preferred embodiment shown in FIG. 3 with exceptions that it has a complementary structure of signal amplifying transistors and the write potential and read potential supply line is separated from the read signal line, namely the global bit line GB1 is involved only in the read signals.

The local bit line LB1 is connected to the gate electrodes for the signal amplifying transistors AMT1 and AMT2 and also to a terminal VP through the selection transistor ST1. Similarly, the local bit line LB2 is connected to the gate electrodes for the signal amplifying transistors AMT2 and AMT2P and also to the terminal VP through the selection transistor ST2. In this case, VP is a terminal, which supplies either the write drain voltage or the read drain voltage. VCC is a terminal, which supplies the read voltage to AMT2P and VSS is a terminal, which supplies the read voltage to the signal amplifying transistors AMLP and AMT2P.

Next, the operation principle for reading information stored in the memory cell MC01 by selecting the word line W01 in the same manner as that of Embodiment 1 is described below.

To read out information, first of all, the selection transistor is turned on, 1 v of voltage is applied from the voltage supply terminal VP to the local bit line for pre-charging, and then the selection transistor AT1 is turned off. The word line W01 is used to select the desired memory cell, in this case, the memory cell MC01. If the memory cell MC01 is 'H', 1 V potential on the local bit line LB1 is not discharged. At that time, the signal amplifying transistor AMT1P is off and the signal amplifying transistor AMT1 is on. At this point, when 1 V of voltage is applied to the source voltage supply terminal VCC and 0 V of voltage is applied to the source voltage supply terminal VSS, 0 V of voltage on the global bit line GB1 is applied because only the signal amplifying transistor AMT1 is on.

In contrast, if the selected memory cell MCB1 is 'L', the potential on the local bit line LB1 is discharged through the memory cell MC01, resulting in the signal amplifying transistor AMT1 being off and the signal amplifying transistor AMTLP being on. At this point, when 1 V of voltage is applied to the source voltage supply terminal VCC and 0 V of voltage is applied to the source voltage supply terminal VSS, a current flows from the source voltage supply terminal VCC into the global bit line GB1 through the signal amplifying transistor AMT1P, resulting in 1 V of voltage applied on the global bit line GB1. This change in voltage may be selected at the single-end type of sense amplifier SA1.

The semiconductor non-volatile storage device according to this preferred embodiment has such an advantage that it ca be clearly determined whether the potential applied on the global bit line GB1 is 1 V or 0 V over the semiconductor non-volatile storage device according to the embodiment shown in FIG. 1. That is because the global bit line GB1 is connected t a 0 V or 1 V power source through the signal amplifying transistor. In the case of the semiconductor non-volatile storage device according to this preferred embodiment, not only their signal amplifying transistors have a higher driving power but also the potential on the global bit line GB1 can be actively controlled, further improving the speed, at which information is read out.

To write information, the selection transistor ST1 is turned on and a positive voltage (in this case, 5 V) is applied from the voltage supply terminal VP to the local bit line LB1 to apply a voltage to the drain for the memory cell array. By applying a positive voltage (in this case, 10 V) on the word line W01 controlling the memory-cell MC01, in which information is to be written, the memory cell MC01 is turned on, information being written in it through hot electron injection. By raising the well potentials of the signal amplifying transistors AMT1 and AMT1P to about 5 V, the electric field applied to the gate insulation film can be mitigated, preventing dielectric breakdown from occurring for the duration of this step. The semiconductor non-volatile storage device according to this preferred embodiment has an advantage that no high voltage (5 V) for write operation is applied to the source and drain diffusion layer of the signal amplifying transistor.

Now, the effects of the separation of the write drain voltage supply line from the read signal line will be described below.

As the structure shown in FIG. 1, to supply a potential via the global bit line GB1, a write voltage is applied to the diffusion layer of the signal amplifying transistor. If a voltage cannot be supplied to the well in time, the potential of the electric field at the junction between the diffusion layers rises spontaneously, which may cause dielectric breakdown. For that reason, it is difficult to synchronize with the timing when a voltage is supplied to the well.

On the other hand, in the case of the semiconductor non-volatile storage device according to this preferred embodiment, which has been so structured that a write voltage is supplied from the voltage supply terminal VP, no high voltage is separately applied to the diffusion layer of the signal amplifying transistor. For that reason, no dielectric breakdown may occur at the junction. Only worry about low withstand voltage performance of the gate remains unsolved, though a certain level of voltage (for example, 1.5 V) can be supplied to the well prior to the initiation of write voltage application. This can reduce the maximum voltage applied to the gate insulation film to 3.5 V. In fact, the voltage applied to the gate insulation film does not reach 3.5

V because further potential is applied at the 1.5 V level in line with the step of write voltage application.

The total area of the memory element becomes larger in return to the separation of the write drain voltage supply line from the read signal line, while the possibility of breakdown of the signal amplifying transistor can be reduced.

<Embodiment 3>

With respect to the preferred embodiment mentioned above, the complementary type of signal amplifying transistor structure is used, while in this embodiment, the p-type MOS transistors AMT1P and AMT2, and the source voltage supply terminal VCC have been removed as shown in FIG. 8. The structure of the semiconductor non-volatile storage device according to this embodiment is described below (the drawing is omitted). The source voltage supply terminal VSS is the terminal for supplying the read source voltage to the signal amplifying transistors AMT1 and AMT2 and the voltage supply terminal VP is the line for supplying the write drain voltage. The basic operation principle is the same as that of the semiconductor non-volatile storage device according to the embodiment shown in FIG. 8 and similarly, an example of the word line W01 used to select the memory cell MC01 is described below.

To read out information, first of all, the potential of the global bit line LB1 is reset to 0 V. 1 V of voltage is applied from the voltage supply terminal VP to the local bit line LB1 and then the selection transistor AT1 is blocked. With this state being kept, the read voltage is applied to the word line W01. If the threshold for the corresponding memory cell MC01 is 'L', the potential on the local bit line BL1 is discharged into the memory source terminal VSM through the memory cell MC01. For that reason, the potential of the gate for the signal amplifying transistor AMT1 connected to the local bit line LB1 is reset to 0 V. At this point, no charge is supplied from the source voltage supply terminal VSS to the global bit line GB1 because the signal amplifying transistor AMT1 is off even when 1 V of voltage is applied to the source voltage supply terminal VSS.

If the threshold for the selected memory cell MC01 is 'H', the signal amplifying transistor AMT1 is turned on because the potential on the local bit line LB1 is kept at 1 V. By applying 1 V of voltage to the source voltage supply terminal VSS, a current flows into the global bit line GB1, causing the potential on the global bit line GB1 to rise up to 1V. This change in voltage may be read out at the sense amplifier SA1. Since the single-end type described in FIG. 1 can be used for the sense amplifier SA1 and its operation principle is completely the same as that of the sense amplifier shown in FIG. 1, the explanation of it is omitted.

In addition to an effect, which achieves fast readout like the embodiment shown in FIG. 1, the semiconductor non-volatile storage device according to this preferred embodiment has only another effect, which is achieved by separating the write drain voltage supply line from the read signal line, namely the effect, which reduces the possibility of dielectric breakdown at the junction of the transistor, compared with the complementary-type of circuit shown in FIG. 8.

<Embodiment 4>

In addition, the semiconductor non-volatile storage device according to this preferred embodiment has the same structure as that of the semiconductor non-volatile storage device, from which the p-type MOS transistors AMT1P and AMT2P, and the source voltage supply terminal VCC have been removed (the drawing is not indicated), though in the former type, the source voltage supply terminal VSS of the signal amplifying transistor is reset to 0 V. This type of semiconductor non-volatile storage device will be described below.

The signal appearing on the global bit line GB1 at read operation and the signal output from the sense amplifier SA1 when being received it differ from those according to Embodiment 3. Similarly, an example of the word line W01 used to select the memory cell MC01 is described below.

First of all, like Embodiment 3, the global bit line GB1 is pre-charged to 1 V. The local bit line LB1 is also pre-charged by applying 1 V of voltage from the voltage supply terminal VP. If the threshold for the selected memory cell MC01 is 'H', the potential on the local bit line LB1 is not discharged, being kept at 1 V. The voltage of the gate for the signal amplifying transistor AMT1 becomes also 1 V, resulting in the signal amplifying transistor AMT1 being also 1 V and the signal amplifying transistor AMT1 being on. At this point, when 0 V of voltage is applied to the source voltage supply terminal VSS, the potential on the global bit line GB1 is discharged through the signal amplifying transistor AMT1, the potential approaching 0 V. Thus, the inverted voltage VDD is applied to the gate for the transistor NM because the input to the inverter INV2 composing the single-end type of sense amplifier SA1 shown in the figure is 0 V. Since the transistor NM s turned on, the input to the inverter INV2 becomes 0 V, resulting in the final output being the voltage VDD.

If the threshold for the selected memory cell MC01 is 'L', the potential on the global bit line GB1 is not discharged, resulting in the last output being 0 V. In Embodiment 3 described before, the sense amplifier SA1 operates in the same manner as that of Embodiment shown in FIG. 1, wherein the threshold for the memory cell MC01 is 'L', the final output is the voltage VDD. In contrast, it must be kept in mind that the signal is completely inverted in this embodiment. The operational characteristic of the semiconductor non-volatile storage device according to this embodiment, wherein the source voltage supply terminal VSS for the signal amplifying transistor is preset to 0 V, lies in that the potential on the pre-charged global bit line GB1 is kept at the low level and does not restore to the high level. Any drop in voltage is caused by charge share by load capacitances in Embodiments 1 and 3, while in this embodiment, the potential can be dropped to 0 V and fixed at this level. For that reason, the semiconductor non-volatile storage device according to this embodiment has an advantage that it can operate more stable than those according to these embodiments, wherein a positive voltage is applied to the source voltage supply terminal VSS for the signal amplifying transistor.

<Embodiment 5>

Figure 9:
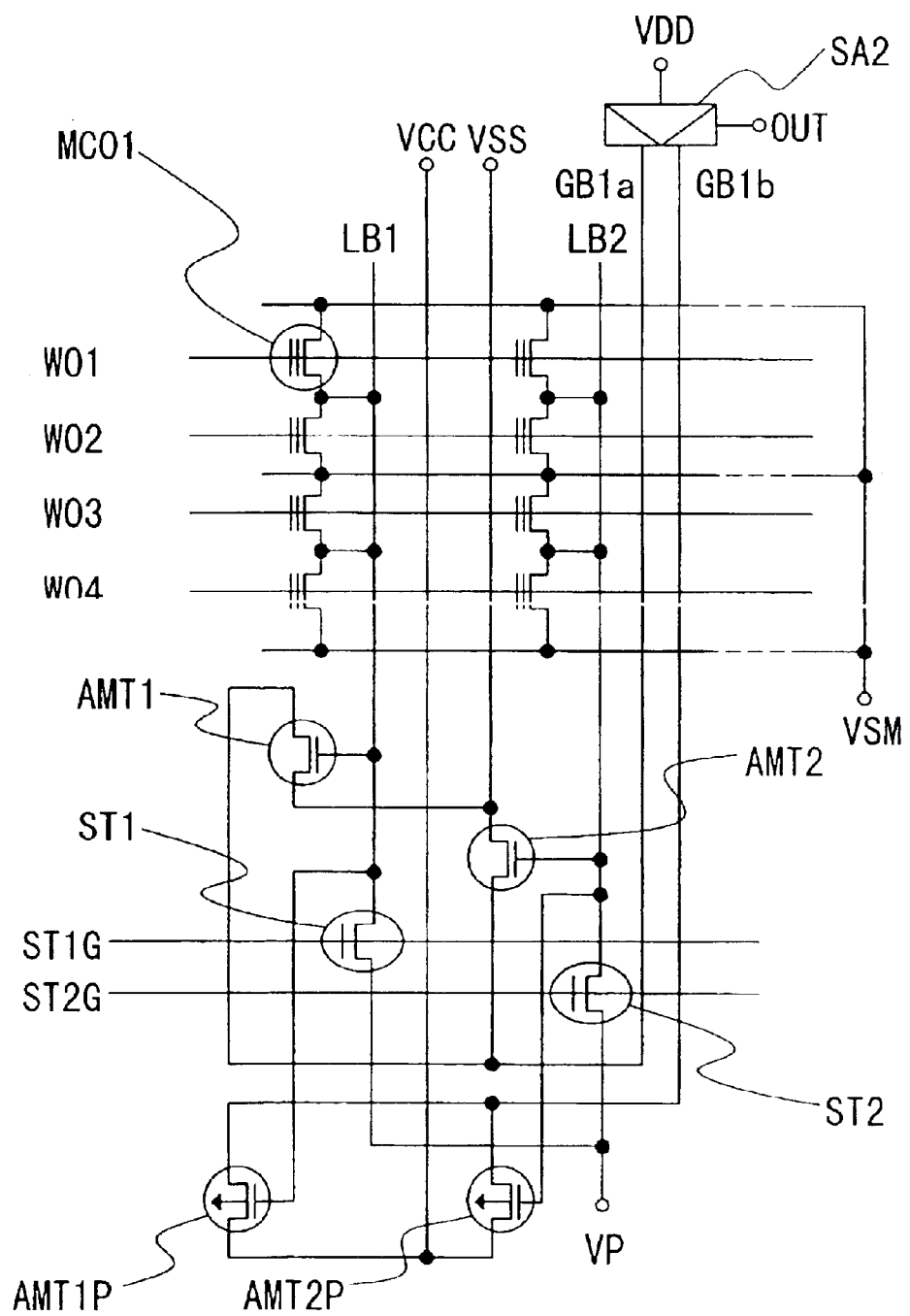
FIG. 9 is a diagram showing the important circuit block of the semiconductor non-volatile storage device according to the first one of other preferred embodiments.

The semiconductor non-volatile storage device according to the embodiment shown in FIG. 9, which uses complimentary type of transistors for the signal amplifying transistors like those according to the embodiment shown in FIG. 8, has a characteristic in that two read lines, namely two global bit lines GB1 and GB2 are provided. In the case of this structure, it is assumed that differential-type sense amplifiers, known for higher sensitivity than that of the single-end type, are used. Note that giving an example of the differential-type sense amplifier accelerates the suitable use of the amplifier shown in FIG. 11, though of cause, any other structure commonly well known one may be used. The operational principle of the differential-type sense amplifier SA2 will be described later. In succeeding paragraphs, read operation will be described giving an example of the memory cell MC01 connected to the local bit line LB1.

The basic read operation is as shown in FIG. 8 and if the threshold for the selected memory cell MC01 is 'L', no signal is output to the global bit line GB1a from the signal amplifying transistor AMT1 and 1 V of voltage is output to the global bit line GB1*b* from the signal amplifying transistor AMTLP. If the threshold for the memory cell MC01 is 'H', 0 V is output to the global bit line GB1*a* from the signal amplifying transistor AMT1 and no signal is output to the global bit line GB1*b* from the signal amplifying transistor AMT1P. By pre-charging the global bit lines GB1*a* and GB1*b* to the intermediate potential (for example, 0.5 V) between 0 V and 1 V, which are the outputs from the signal amplifying transistors, if 0 V is applied to the source voltage supply terminal VSS and 1V is applied to the source voltage supply terminal VCC, the potential of the bit line, to which no signal is output from the signal amplifying transistor is kept at 0.5 V, which causes up to 0.5 V of difference in potential from another line. This difference in potential may be used as a differential component.

Figure 11:
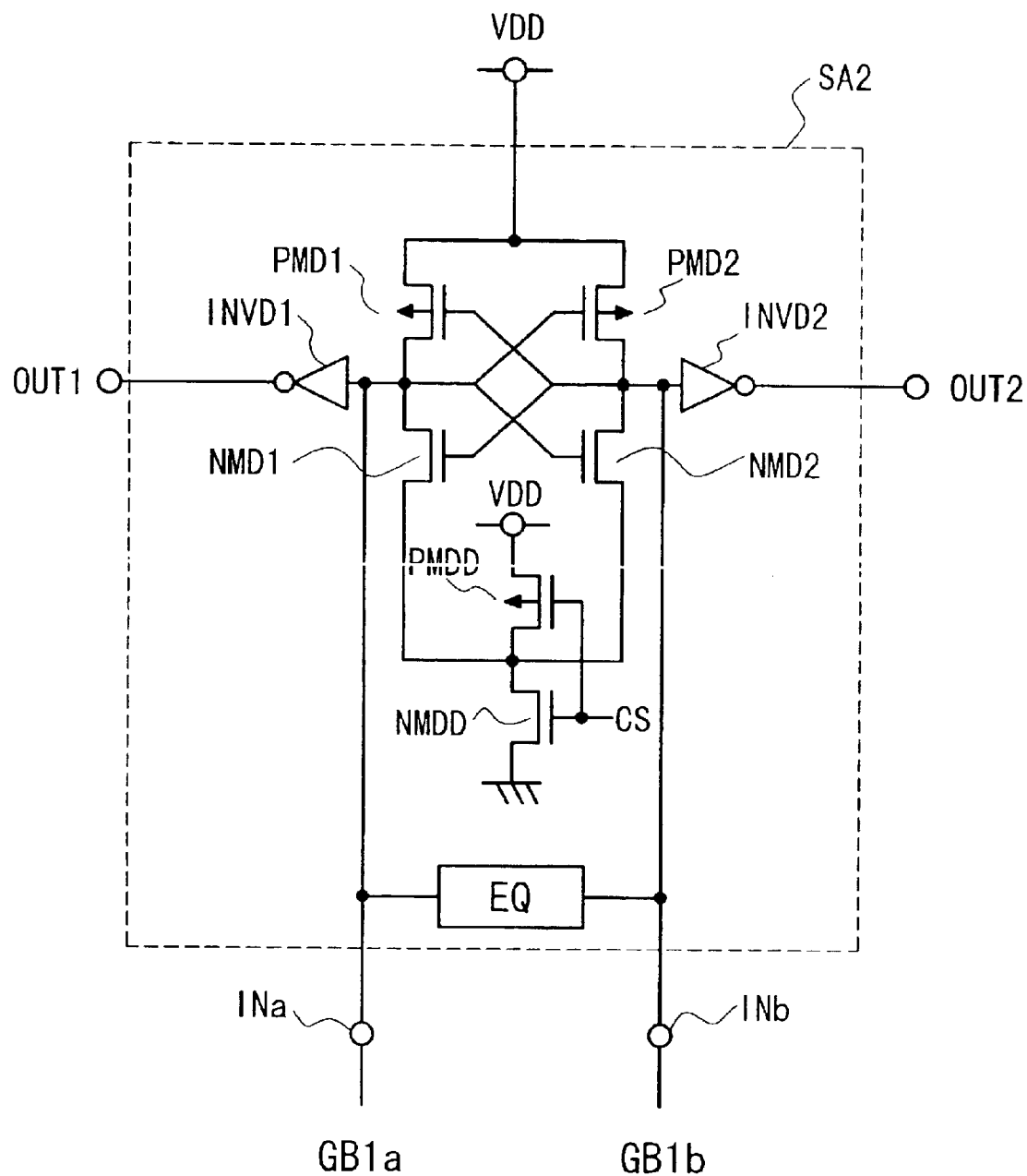
FIG. 11 is a circuit diagram showing one working example of a differential type sense amplifier used in the semiconductor non-volatile storage device of the present invention.

For the differential-type sense amplifier SA2, for example, the sense amplifier with its structure shown in FIG. 11 may be used. The operational principle of this type of differential sense amplifier will be described. A pair of signals 'T1' and 'H' or 'H' and 'L' is input to the input terminals Ina and INb of the differential-type sense amplifier. The logical level '0' is 0 V and '1' indicates the voltage output from the memory cell through the signal amplifying transistor. If 'H' is input to the input terminal INa and 'L' is input to the input terminal INb, the n-type MOS transistor, wherein the gate electrode is connected to the input terminal Ina, is turned on and the p-type MOS transistor PMD2 is turned off. For that reason, '1' transmits to the drain of the n-type MOS transistor NMDD through the n-type MOS transistor NMD2. At this point, when a positive voltage is input to the signal line CS connected to the gate for the n-type MOS transistor, the n-type MOS transistor NMD is also turned on, the potential at the input terminal INb being discharged through the n-type MOS transistors NMD2 and NMDD. This differential-type sense amplifier operates quickly because it initiates the operation in response to a minute change in output. Note that in the case of the n-type MOS transistor NMD1 and p-type MOS transistor PMD1, wherein the gate electrode is connected to the input terminal INb, the sense amplifier operate inversely and the input terminal Ina is fixed at the voltage VDD. The input terminals Ina and INb are connected to the inverters INVD11 and INVD12, respectively, through which OUT1 and OUT2 are output. Global bit lines GB1*a* and GB1*b* may be connected to the input terminals INa and INb of the differential sense amplifier SA2, respectively, which operate as mentioned above. Note that EQ is an equalizing circuit for equalizing the potentials on the global bit lines GB1*a* and GB1*b* connected to the input terminals Ina and INb.

This differential-type sense amplifier SA2 outputs differential outputs OUT1 and OUT2, either of which may be used in the structure with only one output as show in FIG. 9 and it may be determined later, when the sense amplifier(s) is connected, whether both the outputs are used.

Write operation is performed by applying the drain voltage of the memory cell from the voltage supply terminal VP in the same manner as that of the embodiment shown in FIG. 8. Although the area is larger than that shown in FIG. 8 because two global bit lines are required, not only the effect can be obtained using the signal amplifying transistors but also fast readout is enabled with high sensitivity of sense amplifiers introduced. It does without saying that the separation of the write voltage supply line from the read signal line can reduce the possibility of dielectric breakdown in the signal amplifying transistors.

<Embodiment 6>

Figure 10:
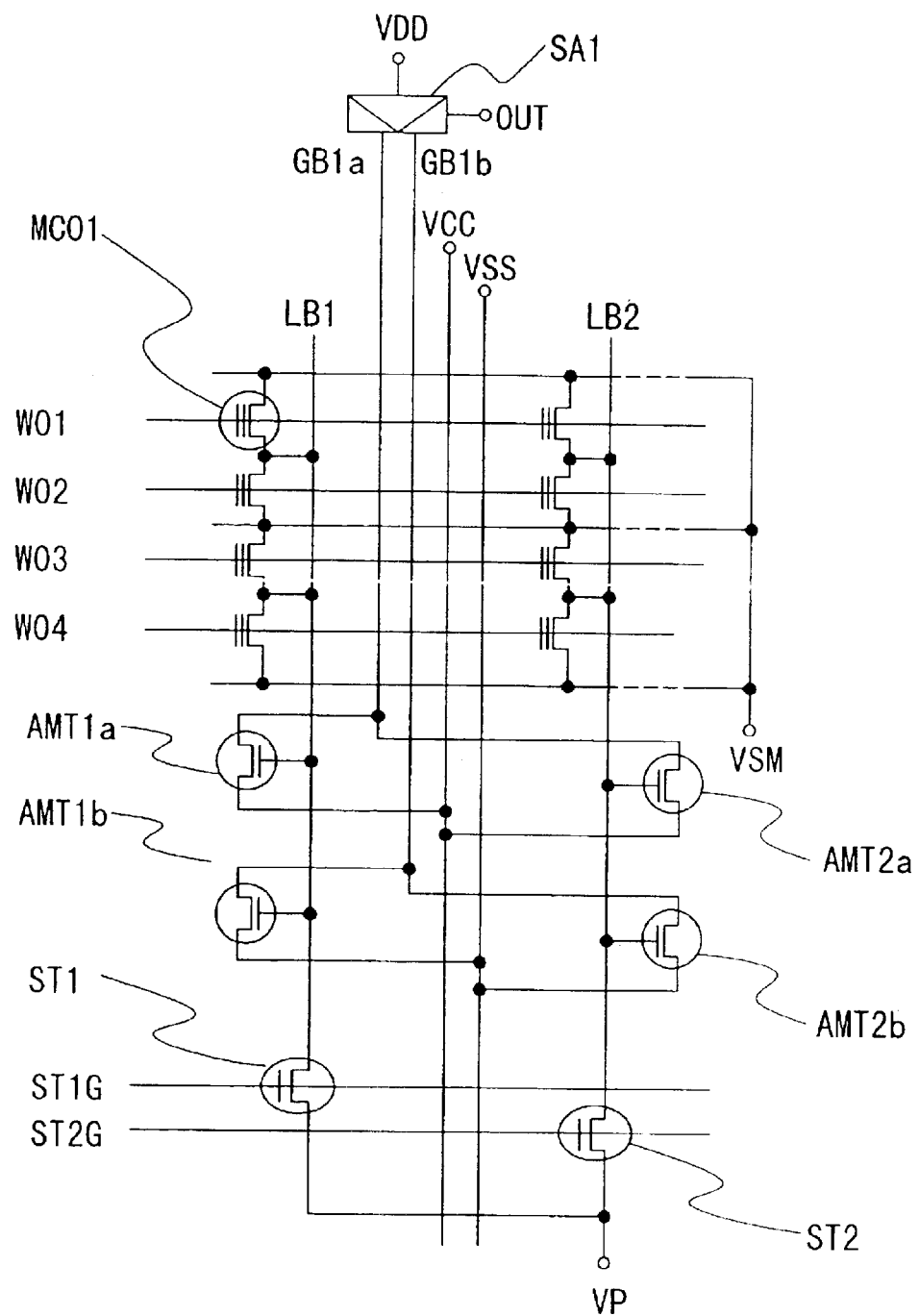
FIG. 10 is a diagram showing the important circuit block of the semiconductor non-volatile storage device according to second one of other embodiments.

The embodiment shown in FIG. 10 is similar to the embodiment shown in FIG. 9 in that two read lines, namely two global bit lines GB1*a* and GB1*b* are provided, through it has a difference in that the signal amplifying transistors AMT1*a* and AMT1*b* are composed only of the n-type MOS transistors. Giving an example of the memory cell connected to the local bit line LB1, the embodiment shown in FIG. 10 will be described below.

To read out information, first of all, the selection transistor ST1 is turned on and 1 V is applied to the local bit line LB1 from the voltage supply terminal VP for pre-charging. Then, the selection transistor ST1 is turned off and the potential on the word line W01 is raised to select the memory cell MC01. If the threshold for the memory cell MC01 is 'L', both the signal amplifying transistors AMT1*a* and AMT1*b* are turned on. Like Embodiment 5, the global bit lines GB1*a* and GB1*b* are pre-charged to 0.5 V and then 1 V of voltage is applied to the source voltage supply terminal VCC and 0 V of voltage is applied to the source voltage supply terminal VSS. The global bit line GB1*a*, when receives the outputs from two signal amplifying transistors AMT1*a* and AMT1*b*, drops down to 0V and the global bit line GB1*b* rises up to 1 V. The maximum difference in potential is 1 V. Using this difference in potential, the differential sense amplifier SA2 is driven.

If the threshold for the memory cell MC01 is 'H', wherein two signal amplifying transistors AMT1*a* and AMT1*b* are off, either of global bit lines GB1*a* and GB1*b* are kept at 0.5 V, no signal being output from the differential-type sense amplifying transistor SA1.

One characteristic of this embodiment lies in that large signal amplitude on the bit line can be used when the threshold for the memory cell is 'L'. In Embodiment 5 shown in FIG. 9, one of paired signal amplifying transistors is always off. Compared with Embodiment 5, the difference in potential for the signal amplitude is larger in the structure according to this embodiment, which has an advantage in enhancing operation speed. This embodiment has an advantage in that since only the same polarity of transistors are used for the signal amplifying transistors, no space for separating the wells as found in the complimentary type is required, enabling the region for the signal amplifying transistors to be further reduced compared with the embodiment shown in FIG. 9. It goes without saying that like the embodiment shown in FIG. 9, the separation of the write voltage supply line from the read signal line can reduce the possibility of dielectric breakdown in the signal amplifying transistors.

Note that if no independent voltage supply terminal VP is incorporated, the drain wiring of the selection transistor may be connected to the global bit line GB1*b* so that the drain potential may be supplied from the global bit line GB1*b* to write and read out information. In this case, the selection transistor must be always off to read information. Excluding this point, the semiconductor non-volatile storage device operates in the completely same manner as that described in reference with this embodiment. This structure can reduce the area required for wiring because the line for supplying the write and read potential is used for the read bit line as well.

As evident from the preferred embodiments described so far, the semiconductor non-volatile storage devices according to the present can be suitably used for non-volatile memory such as flush memory. Note that special attention must be paid to the characteristics and operational conditions of three types of transistors in the case of the semiconductor non-volatile storage devices of the present invention. These characteristics and operational conditions include those for three types of transistors, the signal amplifying transistors, which amplify the signals on the local bit lines and then send out them into the global bit lines, the non-volatile memory cell transistors, and the selection transistors. These characteristics and the operating conditions will be described below.

It is required that the drain voltage Vmd be limited to about 1 V to read information out from the memory cell so that it may lie within the Vth sift limits because any shift in threshold may be caused due to the weak write voltage in the non-volatile memory cell transistors such as flush memory. In addition, it is required that the drain current Ids of the signal amplifying transistor must be able to ensure the current larger than the drain current Idsm of the signal amplifying transistor because the drain voltage Vmd, which is the output voltage from the memory cell, is the maximum value for the voltages input to the gate for the signal amplifying transistor used in the present invention and that the threshold Vth be positive so that no off leak current appears. This means that the performance of the signal amplifying transistor must be higher than that of the memory cell. In other words, the gate voltage Vg and the drain voltage Vg must satisfy the conditions Vg=Vmd and Vd>Vnd for the signal amplifying transistor to operate and that the drain current Ids obtain the characteristic, which satisfies the condition Ids>Idsm, wherein Ids is the drain current of the memory cell to read information out from the memory cell.

For that reason, the general structures required for three types of transistors mentioned above are as described below assuming that the device assembling technique enabling 0.2 μm chips to be produced is used.

The thickness of the gate oxide film for the memory cell transistor is any of 12 to 8 nm, the gate length is any of 0.3 to 0.2 μm, and about 5 V of voltage is essential for the electric strength of the diffusion layer withstand to ensure information writing into the memory cell through hot electron injection.

The thickness of the gate oxide film for the selection transistor is any of 20 to 12 nm, the gate length is any of 0.9 to 0.6 μm, and 10 to 20 V of voltage is required for the electric strength of the diffusion layer to endure the voltage applied to the control gate to overwrite information.

It is sufficient that the thickness of the gate oxide film of the signal amplifying transistor is be thinner than that of the memory cell 8 nm, its gate length is be shorter than that of the memory cell, and the electric strength of the diffusion layer can endure the I/O (Input/Output) voltage, namely about 3.3 V.

Thus, the preferred embodiments of the present invention have been described but not limited only to these embodiments mentioned above and it goes without saying that various types of modification may be made to the embodiments of the present invention within the scope of the present invention. For example, in the descriptions of the preferred embodiments, the sense amplifier has been explained assuming that one sense amplifier corresponds to a plurality of local bit lines, alternatively, one sense amplifier may be incorporated for each local bit line.

INDUSTRIAL APPLICABILITY OF THE INVENTION

The semiconductor non-volatile storage device of the present invention can enhance the speed, at which information is read out from the memory cell. For that reason, the semiconductor non-volatile storage devices such as flush memory can be provided for reading program codes at a high speed. The use of the semiconductor non-volatile storage device may achieve high-performance information equipment at low cost. Among them, with the semiconductor non-volatile storage device of the present invention introduced, high-performance information equipment can be achieved at low cost. It can be suitably used as a temporal storage device, which can read information out at a high speed, in particular, for mobile devices having less space for incorporating it.

What is claimed is:

1. A semiconductor non-volatile storage device comprising:
    a memory cell array being composed of a plurality of memory cells having a region for retaining charge and a control gate;
    a word line connected to the control gate for the memory cell;
    a local bit line, of which one end is connected to a source drain path of the memory cell;
    a MOS transistor, to the gate for which the other end of the local bit line is connected;
    a global bit line, of which one end is connected to the source drain path of the MOS transistor; and
    a signal detection circuit, to which the other end of the global bit line is connected.

2. A semiconductor non-volatile storage device according to claim 1, wherein it has been structured so that the semiconductor non-volatile memory cell having the region for retaining charge and the control gate, which is selected through the word line, may directly receive a change in potential occurring on the local bit line connected to the memory cell at the gate electrode of the MOS transistor when it is turned on or off depending on the information contained in itself and detect a change in current occurring when the MOS transistor is turned on or off in the signal detection circuit.

3. A semiconductor non-volatile storage device according to claim 1, wherein the local bit line has been pre-charged prior to the application of voltage to the word line, through which the memory cell is selected.

4. A semiconductor non-volatile storage device according to claim 1, wherein the MOS transistor is n-type.

5. A semiconductor non-volatile storage device according to claim 1, wherein the MOS transistor is composed of a pair of p-type and n-type MOS transistors, of which gate electrodes are connected to the same local bit line.

6. A semiconductor non-volatile storage device according to claim 5, wherein drain terminals for a pair of MOS drain transistors are connected to the same global bit line.

7. or non-volatile storage device according to claim 5, wherein the drain terminals of the pair of MOB transistors are connected to the different global bit lines, which are connected to the same signal detection circuit.

8. A transistor non-volatile storage device according to claim 1, wherein the MOB transistor is composed of two n-type MOS transistors, for which the individual drain terminals are connected to the different global bit lines, which are connected to the same signal detection circuit.

9. A semiconductor non-volatile storage device according to claim 8, wherein the drain of one MOS transistor, which is not a memory cell, is connected to the local bit line connected to the gate electrodes of the two MOS transistors and a voltage supply terminal is added to applying a voltage for overwriting information to the local bit line through the MOS transistors.

10. A semiconductor non-volatile storage device according to claim 6, wherein the drain of one MOS transistor, which is not a memory cell, is connected to the local bit line connected to the gate electrodes of the two MOS transistors and a voltage supply terminal is added to applying a voltage for overwriting information to the local bit line through the MOS transistors.

11. A semiconductor non-volatile storage device according to claim 8, wherein the drain of one MOS transistor, which is not a memory cell, is connected to the local bit line connected to the gate electrodes of the two MOS transistors and the sources of the MOS transistors are commonly connected to the global bit line, to which the drain of one of two MOS transistors, to the source of which a positive voltage is applied.

12. A semiconductor non-volatile storage device according to claim 11, wherein it has been structured so that a high voltage for overwriting information may be applied to the local bit line from the commonly connected global bit lines.

13. semiconductor non-volatile storage device according to claim 7, wherein the signal detection circuit is a differential-type sense amplifier.

14. A semiconductor non-volatile storage device comprising:
- a memory cell array being composed of a plurality of memory cells having a region for retaining charge and a control gate;
- a word line connected to the control gate for the memory cell;
- a local bit line, of which one end is connected to a source drain path of the memory cell;
- a MOS transistor, to the gate for which the other end of the local bit line is connected;
- a global bit line, of which one end is connected to the source drain path of the MOS transistor; and
- a signal detection circuit, to which the other end of the global bit line is connected,
- wherein the thickness of the insulation film of the gate for the MOS transistor is thinner than that of the gate for the memory cell.

15. A semiconductor non-volatile storage device, wherein it has been structured so that the semiconductor non-volatile memory cell having the region for retaining charge and the control gate, which is selected through the word line, may directly receive a change in potential occurring on the local bit line connected to the memory cell at the gate electrode of the MOS transistor when it is turned on or off depending on the information contained in itself and detect a change in current occurring when the MOS transistor is turned on or off in the signal detection circuit and
- wherein the thickness of the insulation film of the gate for the MOS transistor is thinner than that of the gate for the memory cell.

16. A semiconductor non-volatile storage device according to claim 14, wherein the local bit line is pre-charged prior to the application of voltage to the word line, through which the memory cell is selected.

17. A semiconductor non-volatile storage device according to claim 14, wherein the MOS transistor is of n-type.

18. A semiconductor non-volatile storage device comprising:
- a memory cell array being composed of a plurality of memory cells having a region for retaining charge and a control gate;
- a word line connected to the control gate for the memory cell;
- a local bit line, of which one end is connected to a source drain path of the memory cell;
- a MOS transistor, to the gate for which the other end of the local bit line is connected;
- a global bit line, of which one end is connected to the source drain path of the MOS transistor; and
- a signal detection circuit, to which the other end of the global bit line is connected, and
- wherein the MOS transistor is composed of a pair of p-type and n-type MOS transistors, electrodes of which are connected to the same local bit line.

19. A semiconductor non-volatile storage device, wherein it has been structured so that the semiconductor non-volatile memory cell having the region for retaining charge and the control gate, which is selected through the word line, may directly receive a change in potential occurring on the local bit line connected to the memory cell at the gate electrode of the MOS transistor when it is turned on or off depending on the information contained in itself and detect a change in current occurring when the MOS transistor is turned on or off in the signal detection circuit, and
- wherein the MOS transistor is composed of a pair of p-type and n-type MOS transistors, electrodes of which are connected to the same local bit line.

20. A semiconductor non-volatile storage device according to claim 18, wherein the local bit line has been pre-charged prior to the application of voltage to the word line, through which the memory cell is selected.

21. A semiconductor non-volatile storage device according to claim 18, wherein drain terminals for a pair of MOS drain transistors are connected to the same global bit line.

22. A semiconductor non-volatile storage device according to claim 18, wherein drain terminals for a pair of MOS drain transistors are connected to the different global bit lines, which are connected to the same signal detection circuit.

23. A semiconductor non-volatile storage device according to claim 22, wherein the drain of one MOS transistor, which is not a memory cell, is connected to the local bit line connected to the gate electrodes of the two MOS transistors and a voltage supply terminal is added to apply a voltage for rewriting information to the local bit line through the MOS transistors.

24. A semiconductor non-volatile storage device according to claim 22, wherein the signal detection circuit is a differential-type sense amplifier.

25. A semiconductor non-volatile storage device comprising:
- a memory cell array being composed of a plurality of memory cells having a region for retaining charge and a control gate;
- a word line connected to the control gate for the memory cell;
- a local bit line, of which one end is connected to a source drain path of the memory cell;
- a MOS transistor, to the gate for which the other end of the local bit line is connected;
- a global bit line, of which one end is connected to the source drain path of the MOS transistor; and
- a signal detection circuit, to which the other end of the global bit line is connected, and
- wherein the MOS transistor is composed of two n-type MOS transistors and the individual drain terminals of the MOS transistors connected to two different global bit lines, which are connected to the same signal detection circuit.

26. A semiconductor non-volatile storage device, wherein it has been structured so that the semiconductor non-volatile memory cell having the region for retaining charge and the control gate, which is selected through the word line, may directly receive a change in potential occurring on the local bit line connected to the memory cell at the gate electrode of the MOS transistor when it is turned on or off depending on the information contained in itself and detect a change in current occurring when the MOS transistor is turned on or off in the signal detection circuit, and wherein the MOS transistor is composed of two n-type MOS transistors and the individual drain terminals of the MOB transistors connected to two different global bit lines, which are connected to the same signal detection circuit.

27. A semiconductor non-volatile storage device according to claim 25, wherein the local bit line has been pre-charged prior to the application of voltage to the word line, through which the memory cell is selected.

28. A semiconductor non-volatile storage device according to claim 25, wherein the drain of one MOS transistor, which is not a memory cell, is connected to the local bit line connected to the gate electrodes of the two n-type MOS transistors and a voltage supply terminal is added to apply a voltage for rewriting information to the local bit line through the MOS transistors.

29. A semiconductor non-volatile storage device according to claim 25, wherein the drain of one MOS transistor, which is not a memory cell, is connected to the local bit line connected to the gate electrodes of the two MOS transistors and the sources of the MOS transistors are commonly connected to the global bit line, to which the drain of one of two MOS transistors, to the source of which a positive voltage is applied.

30. A semiconductor non-volatile storage device according to claim 29, wherein it has been structured so that a high voltage for rewriting information may be applied to the local bit line from the commonly connected global bit lines.

31. A semiconductor non-volatile storage device according to claim 25, wherein the signal detection circuit is a differential-type sense amplifier.

32. A semiconductor non-volatile storage device according to claim 2, wherein the local bit line has been pre-charged prior to the application of voltage to the word line, through which the memory cell is selected.

33. A semiconductor non-volatile storage device according to 2, wherein the MOS transistor is n-type.

34. A semiconductor non-volatile storage device according to 2, wherein the MOS transistor is composed of a pair of p-type and n-type MOS transistors, of which gate electrodes are connected to the same local bit line.

35. A semiconductor non-volatile storage device according to claim 34, wherein drain terminals for a pair of MOS drain transistors are connected to the same global bit line.

36. or non-volatile storage device according to claim 35, wherein the drain terminals of the pair of MOS transistors are connected to the different global bit lines, which are connected to the same signal detection circuit.

37. A transistor non-volatile storage device according to claim 2, wherein the MOS transistor is composed of two n-type MOS transistors, for which the individual drain terminals are connected to the different global bit lines, which are connected to the same signal detection circuit.

38. A semiconductor non-volatile storage device according to claim 37, wherein the drain of one MOS transistor, which is not a memory cell, is connected to the local bit line connected to the gate electrodes of the two MOS transistors and a voltage supply terminal is added to applying a voltage for overwriting information to the local bit line through the MOS transistors.

39. A semiconductor non-volatile storage device according to claim 35, wherein the drain of one MOS transistor, which is not a memory cell, is connected to the local bit line connected to the gate electrodes of the two MOS transistors and a voltage supply terminal is added to applying a voltage for overwriting information to the local bit line through the MOS transistors.

40. A semiconductor non-volatile storage device according to claim 37, wherein the drain of one MOS transistor, which is not a memory cell, is connected to the local bit line connected to the gate electrodes of the two MOS transistors and the sources of the MOS transistors are commonly connected to the global bit line, to which the drain of one of two MOS transistors, to the source of which a positive voltage is applied.

41. A semiconductor non-volatile storage device according to claim 40, wherein it has been structured so that a high voltage for overwriting information may be applied to the local bit line from the commonly connected global bit lines.

42. semiconductor non-volatile storage device according to claim 36, wherein the signal detection circuit is a differential-type sense amplifier.

43. A semiconductor non-volatile storage device according to claim 15, wherein the local bit line is pre-charged prior to the application of voltage to the word line, through which the memory cell is selected.

44. A semiconductor non-volatile storage device according to claim 15, wherein the MOS transistor is of n-type.

45. A semiconductor non-volatile storage device according to claim 19, wherein the local bit line has been pre-charged prior to the application of voltage to the word line, through which the memory cell is selected.

46. A semiconductor non-volatile storage device according to claim 19, wherein drain terminals for a pair of MOS drain transistors are connected to the same global bit line.

47. A semiconductor non-volatile storage device according to claim 19, wherein drain terminals for a pair of MOS drain transistors are connected to the different global bit lines, which are connected to the same signal detection circuit.

48. A semiconductor non-volatile storage device according to claim 26, wherein the local bit line has been pre-charged prior to the application of voltage to the word line, through which the memory cell is selected.

49. A semiconductor non-volatile storage device according to claim 26, wherein the drain of one MOS transistor, which is not a memory cell, is connected to the local bit line connected to the gate electrodes of the two n-type MOS transistors and a voltage supply terminal is added to apply a voltage for rewriting information to the local bit line through the MOS transistors.

50. A semiconductor non-volatile storage device according to claim 26, wherein the drain of one MOS transistor, which is not a memory cell, is connected to the local bit line connected to the gate electrodes of the two MOS transistors and the sources of the MOS transistors are commonly connected to the global bit line, to which the drain of one of two MOS transistors, to the source of which a positive voltage is applied.

51. A semiconductor non-volatile storage device according to claim 50, wherein it has been structured so that a high voltage for rewriting information may be applied to the local bit line from the commonly connected global bit lines.

52. A semiconductor non-volatile storage device according to claim 26, wherein the signal detection circuit is a differential-type sense amplifier.

* * * * *